(12) United States Patent
Zhai et al.

(10) Patent No.: US 11,638,357 B2
(45) Date of Patent: Apr. 25, 2023

(54) MOUNTING BASE, FIRE DETECTOR AND FIRE ALARM

(71) Applicant: GULF SECURITY TECHNOLOGY COMPANY LIMITED, Hebei (CN)

(72) Inventors: Guodong Zhai, Tianjin (CN); Fengxia Wang, Beijing (CN); Lixia Liu, Beijing (CN)

(73) Assignee: GULF SECURITY TECHNOLOGY COMPANY LIMITED, Hebei (CN)

( * ) Notice: Subject to any disclaimer, the term of this patent is extended or adjusted under 35 U.S.C. 154(b) by 44 days.

(21) Appl. No.: 17/122,029

(22) Filed: Dec. 15, 2020

(65) Prior Publication Data

US 2021/0259121 A1 Aug. 19, 2021

(30) Foreign Application Priority Data

Feb. 14, 2020 (CN) .......................... 202020169817.2

(51) Int. Cl.
*G08B 17/113* (2006.01)
*H05K 5/02* (2006.01)

(52) U.S. Cl.
CPC ................... *H05K 5/0221* (2013.01)

(58) Field of Classification Search
None
See application file for complete search history.

(56) References Cited

U.S. PATENT DOCUMENTS

| | | | | | |
|---|---|---|---|---|---|
| 4,887,073 | A | * | 12/1989 | Nakao | G08B 17/113 340/693.11 |
| 5,659,293 | A | * | 8/1997 | Shibata | G08B 26/001 340/630 |
| 5,710,541 | A | * | 1/1998 | Stanley | G08B 17/113 361/822 |
| 6,522,254 | B1 | * | 2/2003 | Yamano | G08B 17/107 340/630 |
| 6,666,701 | B1 | * | 12/2003 | Burkhardt | H01R 13/625 439/321 |
| 7,696,896 | B2 | * | 4/2010 | Siber | G08B 17/113 403/368 |
| 8,052,008 | B2 | * | 11/2011 | Drane | H02G 3/185 220/3.6 |
| 8,911,252 | B2 | * | 12/2014 | Sittenauer | H01R 13/625 439/332 |
| 2005/0009405 | A1 | * | 1/2005 | Andres | G08B 17/113 439/638 |

(Continued)

*Primary Examiner* — Xanthia C Cunningham
(74) *Attorney, Agent, or Firm* — Cantor Colburn LLP

(57) ABSTRACT

The present application provides an installation base, and a fire detector or a fire alarm. The installation base includes: a base body, which has a plurality of installation holes; locking assemblies, which are arranged in the installation holes of the base body, and which are switched between a locked position and a released position relative to the installation holes when the locking assemblies are rotated and/or pressed; and conductive assemblies, which hold wires when the locking assemblies are switched to the locked position so that electrical conduction is realized. In the installation base for a fire detector or a fire alarm according to the present application, through a cooperation of the locking assemblies, the base body and the conductive assemblies, quick electrical connection and maintenance of the installation base are realized.

11 Claims, 9 Drawing Sheets

(56) References Cited

U.S. PATENT DOCUMENTS

| | | | | |
|---|---|---|---|---|
| 2008/0074278 A1* | 3/2008 | Anderson | ................ | G08B 3/10 |
| | | | | 340/693.9 |
| 2008/0157992 A1* | 7/2008 | Anderson | ................ | G08B 3/10 |
| | | | | 340/691.1 |
| 2008/0246618 A1* | 10/2008 | Siber | ...................... | G08B 17/10 |
| | | | | 340/577 |
| 2009/0085727 A1* | 4/2009 | Yamano | ................... | G08B 3/10 |
| | | | | 340/384.4 |
| 2012/0052722 A1* | 3/2012 | Smith | .................. | H01R 13/625 |
| | | | | 439/529 |
| 2013/0157502 A1* | 6/2013 | Sittenauer | ............ | H01R 13/625 |
| | | | | 439/546 |
| 2018/0208333 A1* | 7/2018 | Cesari | ................ | H01R 13/6277 |

* cited by examiner

MOUNTING BASE, FIRE DETECTOR AND FIRE ALARM

CROSS-REFERENCE TO RELATED APPLICATIONS

This application claims priority to Chinese Patent Application No. 202020169817.2, filed Feb. 14, 2020, the contents of which are incorporated by reference herein in their entirety.

BACKGROUND

The present application relates to the field of fire detection devices, and more specifically, the present application relates to an installation base of a fire detector or a fire alarm.

Fire detectors and alarms are a kind of building fire detection and alarm equipment with mature technology and wide application. They have the advantages of small space occupied and high sensitivity of result. As the detectors and alarms in a fire protection system usually require power supply and communication, and batteries are not suitable to be used considering the particularity of such equipment, electrical connections of the fire detectors and alarms with a central controller in the building should also usually be realized during the installation. The current common practice is to reserve wires at installation points, and metal fasteners such as bolts are used to press the wires tightly onto a metal guide plate of a fire detector or alarm base to realize the electrical connection between the reserved wires and the detector or alarm. The electrical connection between the detector or alarm and the base is realized by other mechanical structures, which are not covered by the present technology. There is a relatively long assembly time when this type of fire detector or alarm base is fastened and electrically connected to the reserved wires, since it takes time to align the wires and ensure that the wires do not displace when screwing the bolts until the assembly is completed.

SUMMARY

The present application aims to provide an installation base, a fire detector and a fire alarm, so as to at least solve or alleviate some of the problems in the prior art.

In order to achieve at least one object of the present application, according to an aspect of the present application, an installation base is provided, which is used in a fire detector or a fire alarm, wherein the installation base includes: a base body, which has a plurality of installation holes; locking assemblies, which are arranged in the installation holes of the base body, and which are switched between a locked position and a released position relative to the installation holes when the locking assemblies are rotated and/or pressed; and conductive assemblies, which hold wires when the locking assemblies are switched to the locked position so that electrical conduction is realized.

Optionally, the locking assembly includes a rotating-and-pressing locking member and an elastic member; the rotating-and-pressing locking member has a shaft, and a rotating-and-pressing portion and a locking portion arranged at both ends of the shaft, and the locking portion protrudes in a radial direction of the shaft; and the installation hole has a concave hole wall and an axial notch formed on the hole wall; wherein in the locked position, the locking portion of the locking assembly is stopped by the hole wall of the installation hole; and in the released position, the locking portion of the locking assembly is reset via the axial notch on the hole wall.

Optionally, the locking assembly includes a pressing locking member and a rotating stopper; the pressing locking member and the rotating stopper have stop teeth axially cooperating with each other; the installation hole has a concave hole wall, an end of the hole wall presents stop teeth, and an axial notch is formed on the hole wall; wherein in the locked position, the rotating stopper of the locking assembly is stopped by the hole wall of the installation hole; and in the released position, the rotating stopper of the locking assembly is reset via the axial notch on the hole wall.

Optionally, the locking assembly includes a rotating locking member, and the rotating locking member has a shaft, and a rotating portion and a locking contact surface arranged at both ends of the shaft; the installation hole has a stop portion that restricts an axial movement of the rotating locking member; wherein an axial length of an abutting position of the locking contact surface and the conductive assembly in the locked position is greater than the axial length of the abutting position of the locking contact surface and the conductive assembly in the released position.

Optionally, the locking assembly includes a conductive rotating locking member; the conductive rotating locking member includes a rotating portion, and a notch and a locking groove that are provided on a circumferential wall of the rotating portion; the installation hole has a stop portion that restricts an axial movement of the conductive rotating locking member; wherein in the locked position, the conductive rotating locking member of the locking assembly holds the wire onto the conductive assembly via the locking groove; and in the released position, the conductive rotating locking member of the locking assembly releases the wire via the notch.

Optionally, the locking groove of the conductive rotating locking member has an edge for cutting off an outer cover of the wire.

Optionally, the conductive assembly includes a conductive substrate provided at a bottom of the conductive rotating locking member.

Optionally, the conductive assembly includes a conductive substrate arranged on the base body, and a pivotable conductive sheet, and when the locking assembly is switched to the locked position, the pivotable conductive sheet is pressed to hold the wire onto the conductive substrate, so that electrical conduction is realized.

Optionally, the installation hole is configured to extend and protrude relative to one side of the base body.

In order to achieve at least one object of the present application, according to another aspect of the present application, a fire detector is also provided, which includes the installation base as described above.

In order to achieve at least one object of the present application, according to another aspect of the present application, a fire alarm is also provided, which includes the installation base as described above.

According to the installation base and the fire detector or the fire alarm of the present application, by performing a rotating and/or pressing operation on the locking assembly, the locking assembly can correspondingly rotate and/or reciprocate relative to the installation hole on the base body of the installation base, so as to actuate the conductive assembly to switch between a locked position and a released position and hold the wire onto the installation base when in the locked position, thereby realizing quick electrical connection and maintenance of the installation base.

The foregoing features and elements may be combined in various combinations without exclusivity, unless expressly indicated otherwise. These features and elements as well as the operation thereof will become more apparent in light of the following description and the accompanying drawings. It should be understood, however, that the following description and drawings are intended to be illustrative and explanatory in nature and non-limiting.

BRIEF DESCRIPTION OF THE DRAWINGS

The subject matter is particularly pointed out and distinctly claimed at the conclusion of the specification. The foregoing and other features, and advantages of the present disclosure are apparent from the following detailed description taken in conjunction with the accompanying drawings in which:

DETAILED DESCRIPTION

Figure 1A:
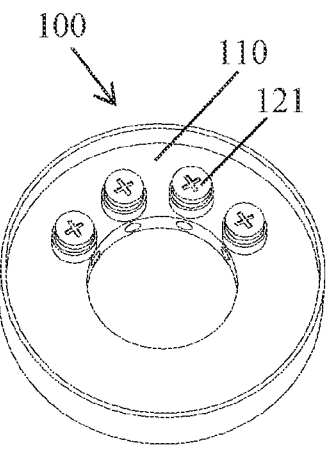
FIGS. 1a-1g are a schematic structural view and schematic views of an assembly process of an embodiment of an installation base of the present application.

As shown and described herein, various features of the disclosure will be presented. Various embodiments may have the same or similar features and thus the same or similar features may be labeled with the same reference numeral, but preceded by a different first number indicating the figure to which the feature is shown. Although similar reference numbers may be used in a generic sense, various embodiments will be described and various features may include changes, alterations, modifications, etc. as will be appreciated by those of skill in the art, whether explicitly described or otherwise would be appreciated by those of skill in the art.

First, it should be noted that the components, working principle, characteristics, advantages and the like of the installation base, the fire detector and the fire alarm according to the present application will be described below by way of example, but it should be understood that all the descriptions are given by way of illustration only and should not be construed as limiting the present disclosure in any way.

In addition, for any single technical feature described or implied in the embodiments mentioned herein, or any single technical feature shown or implied in individual drawings, the present application still allows these technical features (or equivalents thereof) to be further arbitrarily combined or added or deleted without any technical obstacle, thereby obtaining more other embodiments of the present application that may not have been directly mentioned herein.

Returning to the present application, four embodiments of the installation base for a fire detector or a fire alarm according to the present application are shown schematically in FIGS. 1 to 4 respectively, which respectively illustrate the structure, configuration and assembly process of the installation base in each embodiment. It should be understood that although the various embodiments may have some differences in details of features, they are all derived from the same inventive concept. Therefore, when there is no obvious conflict between the details of features in the various embodiments, the features may be combined or replaced with each other to form more other embodiments.

Hereinafter, the common technical solution of the present disclosure will be first described in detail with reference to these drawings. Taking FIGS. 1a-1c as an example, an installation base 100 of the common technical solution includes a base body 110, locking assemblies 120 and conductive assemblies 130. The installation base 100 is used as a basic part for the installation of a fire detector or a fire alarm, and a plurality of installation holes 111 are provided on the installation base 100 to accommodate the locking assemblies 120. In addition, the installation base 100 may also be configured as an axially hollow structure, and radial through holes are provided on a wall of the hollow structure to connect to the installation holes 111 to facilitate the assembly of wires 140. In addition, the locking assemblies 120 arranged in the installation holes 111 of the base body 110 can move relative to the installation holes 111. Specifically, the locking assembly 120 has a locked position and a released position, and when it is rotated and/or pressed, it is switched between the locked position and the released position relative to the installation hole 111. When the locking assembly 120 is switched to the locked position, the conductive assembly 130 holds the wire 140. By using the installation base of the fire detector or fire alarm in this arrangement, when the locking assemblies are rotated and/or pressed, they can correspondingly rotate and/or reciprocate relative to the installation holes on the base body of the installation base, so as to actuate the conductive assemblies to switch between a locked position and a released position and hold the wires onto the installation base when in the locked position, thereby realizing quick electrical connection and maintenance of the installation base.

In addition, on the basis of the common technical solution introduced in the above embodiment, several modifications may also be made to the various components of the installation base in order to obtain similar technical effects or additional technical effects, which will be exemplified as follows.

Figure 1B:
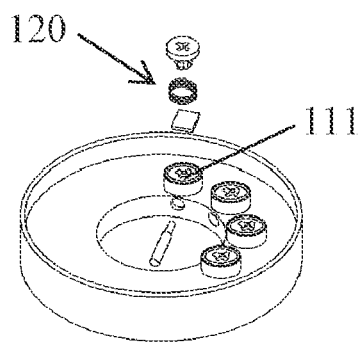
Figure 1C:
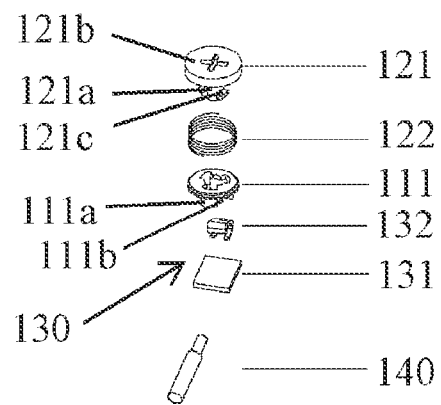

First, referring to FIGS. 1a-1c, the locking assemblies 120 in this embodiment can be used to perform rotating and pressing operations to realize the assembly and electrical connection of the installation base 100. Specifically, the locking assembly 120 includes a rotating-and-pressing locking member 121 and an elastic member 122, wherein the rotating-and-pressing locking member 121 is configured into a shape similar to a bolt, and may be made of a non-conductive material herein. The rotating-and-pressing locking member 121 has a shaft 121a, and a rotating-and-pressing portion 121b and a locking portion 121c arranged at both ends of the shaft 121a. The rotating-and-pressing portion 121b is formed into a disc-shaped structure for facilitating user's operations, and the locking portion 121c is formed to extend in a radial direction of the shaft 121a. Correspondingly, the installation hole 111 has a hole wall 111a that is concave relative to the base body 110, and an axial notch 111b formed on the hole wall 111a. The elastic member 122 is arranged between the rotating-and-pressing locking member 121 and the hole wall 111a of the installation hole 111. With this arrangement, in the locked position, the locking portion 121c of the locking assembly 120 is stopped by the hole wall 111a of the installation hole 111; and in the released position, the locking portion 121c of the locking assembly 120 is reset via the axial notch 111b on the hole wall 111a, thereby realizing a rapid assembly and electrical connection process of the installation base 100 and making it easy to maintain and replace parts.

Figure 1D:
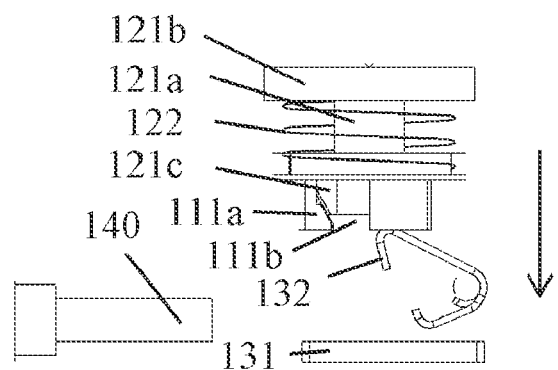
Figure 1E:
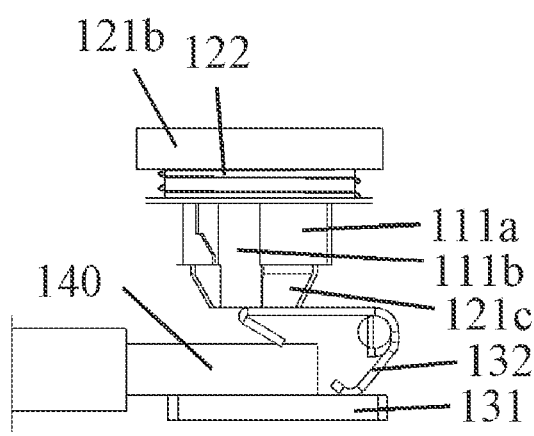

More specifically, as shown in FIGS. 1d-1e, the conductive assembly 130 includes a conductive substrate 131 arranged on the base body 110, and a pivotable conductive sheet 132. With this arrangement, when the locking assembly 120 is switched to the locked position, the pivotable conductive sheet 132 is pressed by the rotating-and-pressing portion 121b to hold the wire onto the conductive substrate 131, thereby realizing electrical conduction.

In addition, the installation hole 111 may also be configured to extend and protrude relative to one side of the base body 110, so as to accommodate the locking assembly 120 therein and protect it from damage.

The assembly and electrical connection process of the installation base 100 according to the above embodiment will be described below in connection with FIGS. 1d-1g.

As shown in FIG. 1d, before the start of the assembly, the locking assembly 120 is in the released position, and the conductive assembly 130 is not actuated, so the pivotable conductive sheet 132 is not in contact with the conductive substrate 131. At this point, the wire 140 can be inserted between the pivotable conductive sheet 132 and the conductive substrate 131 first, and then the rotating-and-pressing portion 121b of the locking assembly 120 is pressed, so as to actuate the locking portion 121c via the shaft 121a to move downward along the axial notch 111b of the installation hole 111.

Referring to FIG. 1e, the downward moving locking portion 121c can press the pivotable conductive sheet 132 so that the pivotable conductive sheet 132 abuts the wire 140 to contact with the conductive substrate 131 to realize electrical connection between the wire and the installation base. Then, the rotating-and-pressing portion 121b of the locking assembly 120 is rotated, so as to actuate the locking portion 121c via the shaft 121a to rotate until the locking portion 121c rotates below the hole wall 111a of the installation hole 111. At this point, the pressing and rotating operations on the rotating-and-pressing portion 121b are released, and the rotating-and-pressing portion 121b is stopped by the hole wall 111a and held in a state of pressing the pivotable conductive sheet 132, thereby realizing the assembly between the wire and the installation base.

Figure 1F:
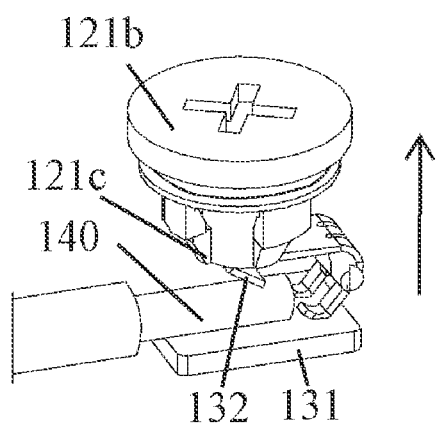
Figure 1G:
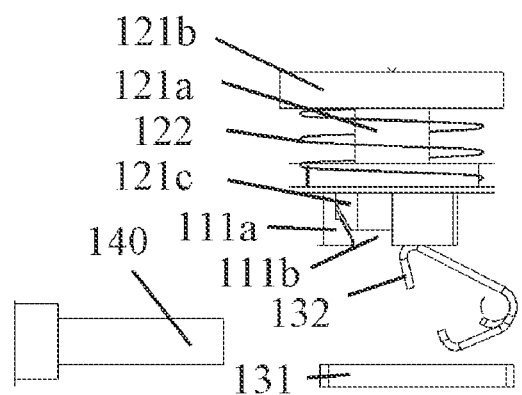

Reference is then made to FIG. 1f, when it is necessary to maintain or replace parts of the installation base 100, the foregoing operations can be performed in a reverse order; that is, the rotating-and-pressing portion 121b of the locking assembly 120 is rotated first, so as to actuate the locking portion 121c via the shaft 121a to rotate until it rotates below the axial notch 111b of the installation hole 111 (and aligns with the axial notch 111b in the axial direction). At this point, the pressing and rotating operations on the rotating-and-pressing portion 121b are released, as shown in FIG. 1g, and the rotating-and-pressing portion 121b is reset when actuated by the elastic member 122, thereby realizing the resetting of the entire locking assembly 120; then the pivotable conductive sheet 132 is also reset due to the loss of pressure, thereby realizing the disassembly between the wire and the installation base. The wire 140 is taken out so that parts can be maintained or replaced.

Figure 2A:
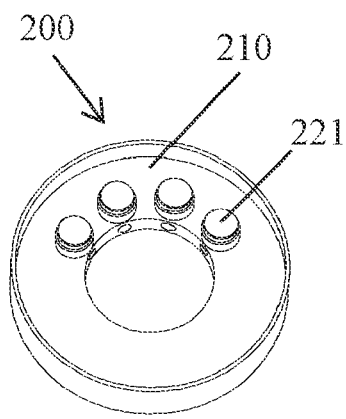
FIGS. 2a-2f are a schematic structural view and schematic views of an assembly process of another embodiment of the installation base of the present application.
Figure 2B:
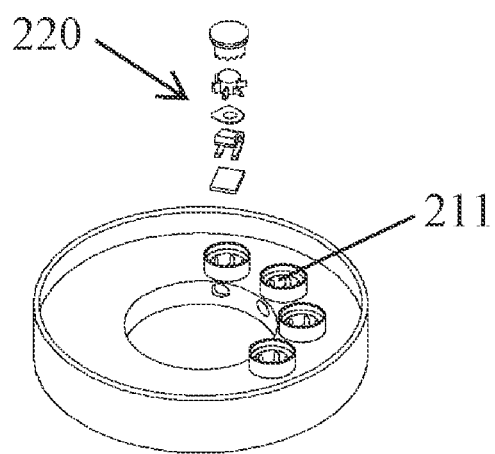
Figure 2C:
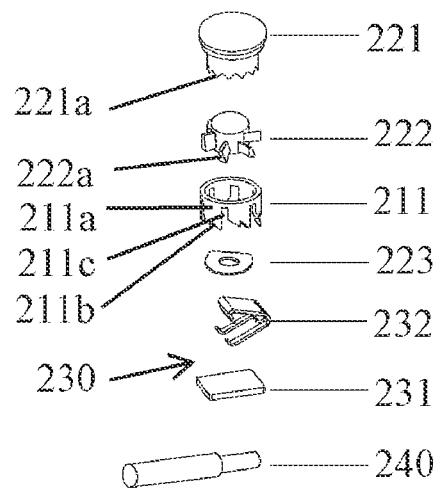

Reference is then made to FIGS. 2a-2c, the locking assembly 220 in this embodiment can be used to perform a pressing operation to realize the assembly and electrical connection of the installation base 200. Specifically, the locking assembly 220 includes a pressing locking member 221 and a rotating stopper 222. The pressing locking member 221 is configured into a shape similar to a bolt, and may be made of a non-conductive material herein. The pressing locking member 221 can be formed into a hollow columnar structure with one end open, wherein the unopen end can be formed into a disc-shaped structure for facilitating user's operations, and the other open end forms stop teeth 221a. The rotating stopper 222 is also formed into a columnar structure, and the pressing locking member 221 can be assembled with the rotating stopper 222 by inserting the open end of the pressing locking member 221 into the rotating stopper 222. In addition, the rotating stopper 222 also has stop teeth 222a matching the stop teeth 221a of the pressing locking member 221 in the axial direction. Correspondingly, the installation hole 211 also has a hole wall 211a that is concave relative to the base body 210 and presents stop teeth 211b at the end, and an axial notch 211c formed on the hole wall 211a. With this arrangement, in the locked position, the rotating stopper 222 of the locking assembly 220 is stopped by the hole wall 211a of the installation hole 211; and in the released position, the rotating stopper 222 of the locking assembly 220 is reset via the axial notch 211c on the hole wall 211a, thereby realizing a rapid assembly and electrical connection of the installation base 200, and making it easy to maintain and replace parts.

More specifically, the conductive assembly 230 includes a conductive substrate 231 arranged on the base body 210, and a pivotable conductive sheet 232. With this arrangement, when the locking assembly 220 is switched to the locked position, the pivotable conductive sheet 232 is pressed by the locking assembly 220 to hold the wire onto the conductive substrate 231 so that electrical conduction is realized.

In addition, since the aforementioned pressing locking member 221 and the rotating stopper 222 of the locking assembly 220 have special shapes, in order to provide a better pressing effect to the pivotable conductive sheet 232, a holder 223 may be further provided under the rotating stopper 222 to make the pivotable conductive sheet 232 more uniformly stressed.

Furthermore, similarly, the installation hole 211 may also be configured to extend and protrude relative to one side of the base body 210, so as to accommodate the locking assembly 220 therein and protect it from damage.

The assembly and electrical connection process of the installation base 200 according to the above embodiment will be described below in connection with FIGS. 2d-2f.

Figure 2D:
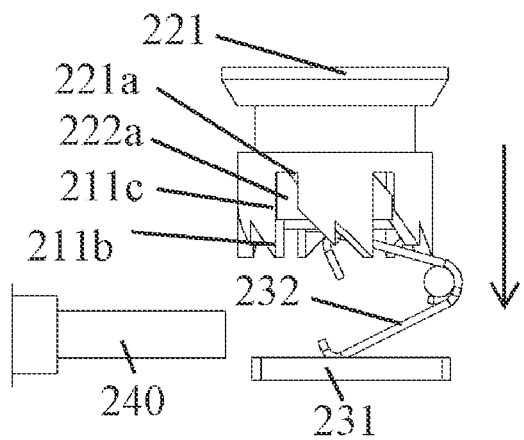

As shown in FIG. 2d, before the start of the assembly, the locking assembly 220 is in the released position, and the conductive assembly 230 is not actuated, so the pivotable conductive sheet 232 is not in contact with the conductive substrate 231. At this point, the wire 240 can be inserted between the pivotable conductive sheet 232 and the conductive substrate 231 first, and then the pressing locking member 221 of the locking assembly 220 is pressed downward. Through a cooperation with the rotating stopper 222, the pressing locking member 221 actuates the stop teeth 222a on the rotating stopper 222 to move downward along the axial notch 211c of the installation hole 211.

Figure 2E:
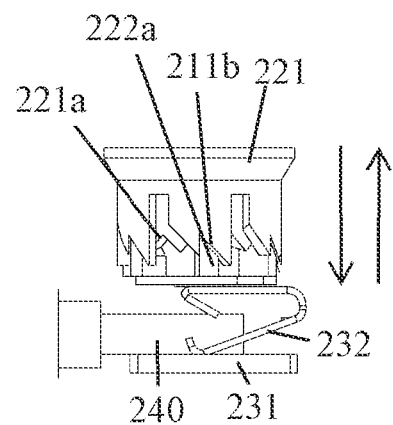

Referring to FIG. 2e, the downward moving rotating stopper 222 can press the pivotable conductive sheet 232 through the holder 223, so that the pivotable conductive sheet 232 abuts the wire 240 to contact with the conductive substrate 231 to realize electrical connection between the wire and the installation base. Then, the pressing operation on the pressing locking member 221 is released. At this point, under the guidance of the inclined surfaces of the stop teeth 222a of the rotating stopper 222 and the stop teeth 211b at the end of the hole wall 211a of the installation hole 211, the force of the rotating stopper 222 is decomposed, and it is actuated to rotate until it is caught between the stop teeth 211b at the end of the hole wall 211a. At this point, although the rotating stopper 222 has a slight upward displacement, it still remains in a state of pressing the pivotable conductive sheet 232 to realize the assembly between the wire and the installation base.

Figure 2F:
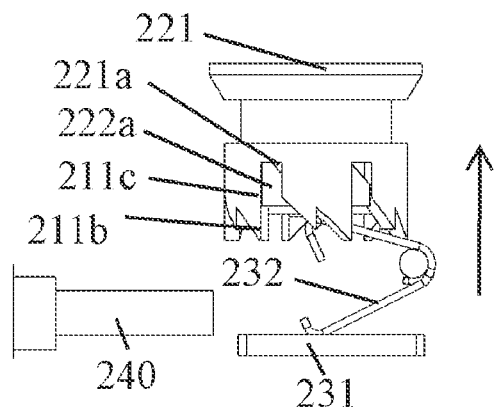

Reference is then made to FIG. 2f, when it is necessary to maintain or replace parts of the installation base 200, the foregoing operations can be repeated; that is, the pressing locking member 221 of the locking assembly 220 is pressed downward first. Through a cooperation with the rotating stopper 222, the pressing locking member 221 actuates the stop teeth 222a on the rotating stopper 222 to move downward between the stop teeth 211b at the end of the hole wall 211a of the installation hole 211. Then, the pressing operation on the pressing locking member 221 is released. At this point, under the guidance of the inclined surfaces of the stop teeth 222a of the rotating stopper 222 and the stop teeth 211b at the end of the hole wall 211a of the installation hole 211, the force of the rotating stopper 222 is decomposed, and it is actuated to rotate until it returns to the axial notch 211c and moves upward along it, thereby realizing the resetting of the entire locking assembly 220. Then, the pivotable conductive sheet 232 is also reset due to the loss of pressure, thereby realizing the disassembly between the wire and the installation base. The wire 240 is taken out so that parts can be maintained or replaced.

Figure 3A:
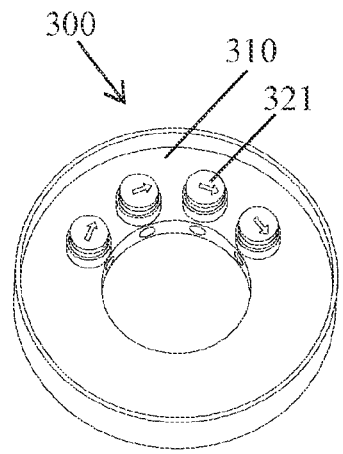
FIGS. 3a-3f are a schematic structural view and schematic views of an assembly process of further another embodiment of the installation base of the present application.
Figure 3B:
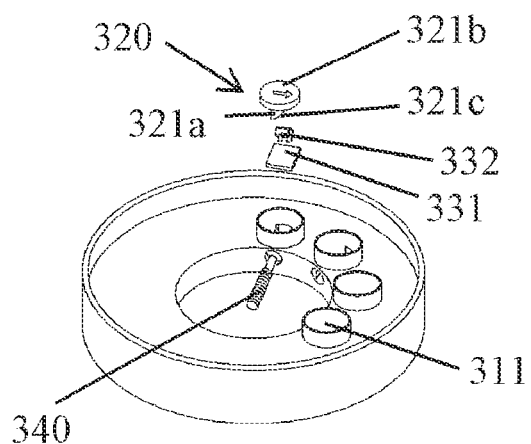

Next, reference is made to FIGS. 3a-3b, the locking assembly 320 in this embodiment can be used to perform a rotating operation to realize the assembly and electrical connection of the installation base 300. Specifically, the locking assembly 320 includes a rotating locking member 321. The rotating locking member 321 is configured into a shape similar to a bolt, and may be made of a nonconductive material herein. The rotating locking member 321 has a shaft 321a, which has a rotating portion 321b formed into a disc-shaped structure at a first end thereof to facilitate user's operations, and has a locking contact surface 321c at a second end thereof. The abutting position of the locking contact surface 321c and the conductive assembly 330 has a varying axial length. Correspondingly, although not shown in the drawings, the installation hole 311 may have a stop portion that restricts an axial movement of the rotating locking member 321. With this arrangement, an axial length of the abutting position of the locking contact surface 321c and the conductive assembly 330 in the locked position is greater than the axial length of the abutting position of the locking contact surface 321c and the conductive assembly 330 in the released position. As a result, a rapid assembly and electrical connection process of the installation base 300 is realized, and it is easy to maintain and replace parts.

More specifically, the conductive assembly 330 includes a conductive substrate 331 arranged on the base body 310, and a pivotable conductive sheet 332. With this arrangement, when the locking assembly 320 is switched to the locked position, the pivotable conductive sheet 332 is pressed by the locking assembly 320 to hold the wire onto the conductive substrate 331, thereby realizing electrical conduction.

Furthermore, similarly, the installation hole 311 may also be configured to extend and protrude relative to one side of the base body 310, so as to accommodate the locking assembly 320 therein and protect it from damage.

The assembly and electrical connection process of the installation base 300 according to the above embodiment will be described below in connection with FIGS. 3c-3f.

Figure 3C:
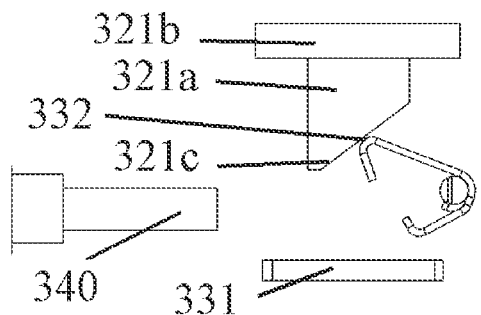
Figure 3D:
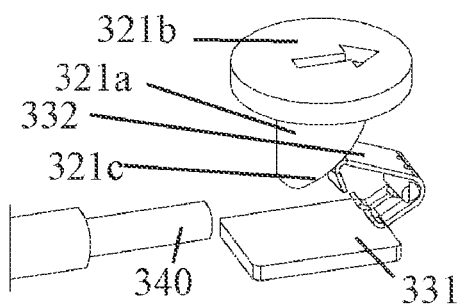

As shown in FIGS. 3c and 3d, before the start of the assembly, the locking assembly 320 is in the released position, and the conductive assembly 330 is not actuated, so the pivotable conductive sheet 332 is not in contact with the conductive substrate 331. At this point, the wire 340 can be inserted between the pivotable conductive sheet 332 and the conductive substrate 331 first, and then the rotating portion 321b of the locking assembly 320 is rotated clockwise, which drives the locking contact surface 321c via the shaft 321a to also rotate clockwise.

Figure 3E:
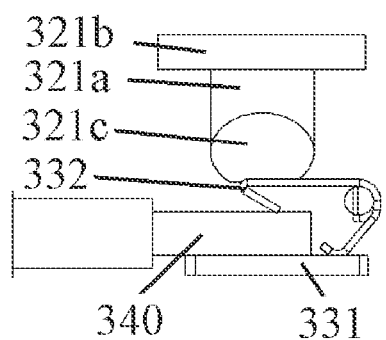

Referring to FIG. 3e, at the abutting position with the pivotable conductive sheet 332, the axial length of the locking contact surface 321c rotating clockwise becomes longer (for example, in a case where the locking contact surface 321c is an inclined surface, that is, a tip end of the inclined surface has a longer axial length than a tail end thereof), so that the pivotable conductive sheet 332 is pressed and abuts the wire 340 to contact with the conductive substrate 331, thereby realizing the electrical connection between the wire and the installation base. Then, the rotating operation on the rotating portion 321b of the locking assembly 320 is released, and the locking assembly 320 as a whole is kept in the current state at this point, thereby realizing the assembly between the wire and the installation base.

Figure 3F:
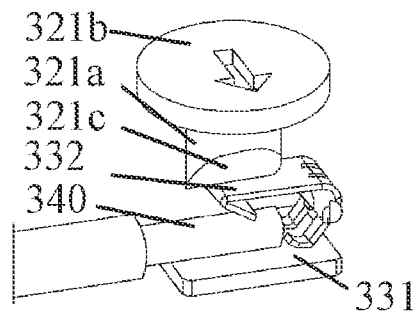

Reference is then made to FIG. 3f, when it is necessary to maintain or replace parts of the installation base 300, the foregoing operations can be performed in a reverse order; that is, the rotating portion 321b of the locking assembly 320 is rotated counterclockwise first, and the rotating portion 321b actuates the locking contact surface 321c via the shaft 321a to also rotate counterclockwise. Then, at the abutting position with the pivotable conductive sheet 332, the axial length of the locking contact surface 321c rotating counterclockwise becomes shorter, thereby realizing the resetting of the entire locking assembly 320; then the pivotable conductive sheet 332 is released and also reset due to the loss of pressure, thereby realizing the disassembly between the wire and the installation base. The wire 340 is taken out so that parts can be maintained or replaced.

Figure 4A:
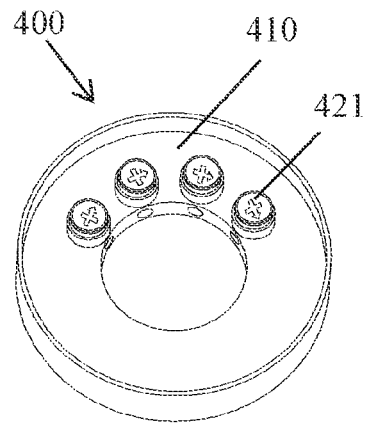
FIGS. 4a-4g are a schematic structural view and schematic views of an assembly process of still further embodiment of the installation base of the present application.
Figure 4B:
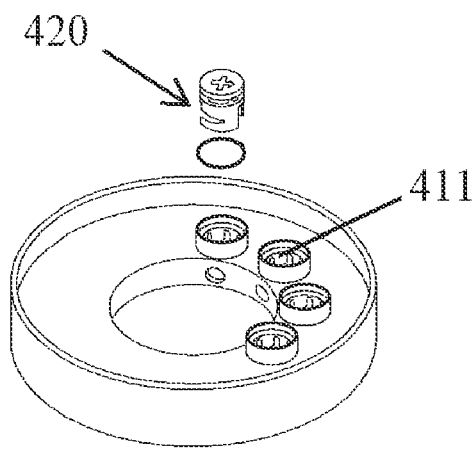
Figure 4C:
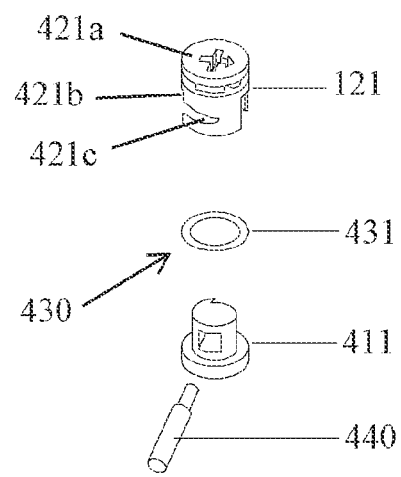

Next, reference is made to FIGS. 4a-4c, the locking assembly 420 in this embodiment can be used to perform a rotating operation to realize the assembly and electrical connection of the installation base 400. Specifically, the locking assembly 420 includes a conductive rotating locking member 421. The conductive rotating locking member 421 has a rotating portion 421a formed into a disc-shaped structure for facilitating user's operations, as well as a notch 421b and a locking groove 421c that are provided on a circumferential wall of the rotating portion 421a. Correspondingly, although not shown in the drawings, the installation hole 411 may have a stop portion that restricts an axial movement of the conductive rotating locking member 421. With this arrangement, in the locked position, the conductive rotating locking member 421 of the locking assembly 420 holds the wire onto the conductive assembly 430 via the locking groove 421c; and in the released position, the conductive rotating locking member 421 of the locking assembly 420 releases the wire via the notch 421b. As a result, a rapid assembly and electrical connection process of the installation base 400 is realized, and it is easy to maintain and replace parts.

More specifically, the conductive assembly 430 includes a conductive substrate 431 provided at a bottom of the conductive rotating locking member 421. With this arrangement, when the locking assembly 420 is switched to the locked position, the wire can be directly pressed and held onto the conductive substrate 431 to realize electrical conduction.

Furthermore, similarly, the installation hole 411 may also be configured to extend and protrude relative to one side of the base body 410, so as to accommodate the locking assembly 420 therein and protect it from damage.

In addition, the locking groove 421c of the conductive rotating locking member 421 also has an edge for cutting off an outer cover of the wire. The conductive rotating locking member with this arrangement can also cut off the outer insulating cover of the wire while the wire is assembled, which further omits the operation of stripping the outer insulating cover of the wire end separately and saves time.

The assembly and electrical connection process of the installation base 400 according to the above embodiment will be described below in connection with FIGS. 4d-4f.

Figure 4D:
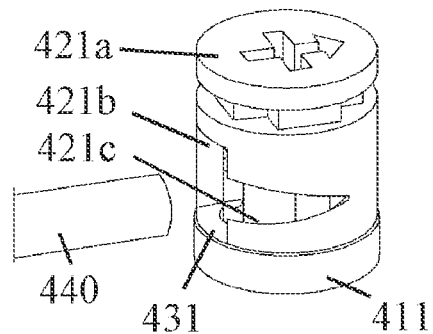

As shown in FIG. 4d, before the start of the assembly, the locking assembly 420 is in the released position, and the conductive assembly 430 is not actuated, so the wire thereof is not in contact with the conductive substrate 431. At this point, the wire 440 can be first arranged above the conductive substrate 431 by being inserted into the notch 421b of the conductive rotating locking member 421 to prepare for the assembly.

Figure 4E:
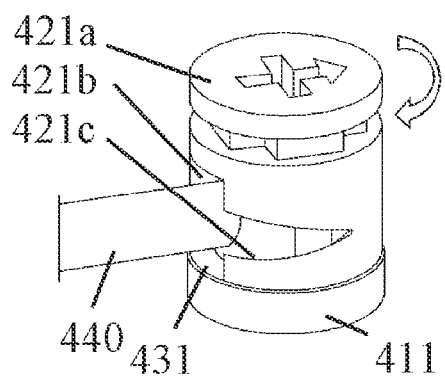

Referring to FIG. 4e, the rotating portion 421a of the locking assembly 420 is rotated clockwise, which actuates the circumferential wall of the conductive rotating locking member 421 to also rotate clockwise, so that the positions of the notch 421b and the locking groove 421c on the wall are changed; namely, the locking groove 421c is at a position where the notch 421b is originally located, thereby clamping the wire, or even stripping the outer insulating cover of the wire. The wire is pressed to abut and contact with the conductive substrate 331 to realize electrical connection and assembly between the wire and the installation base.

Figure 4F:
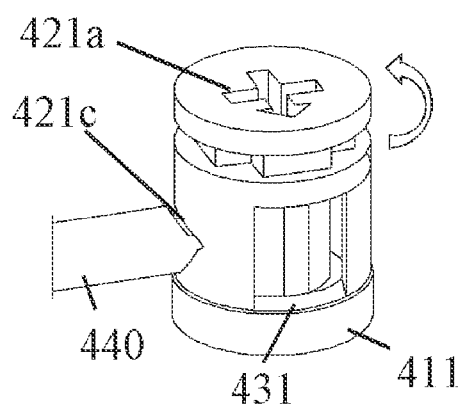
Figure 4G:
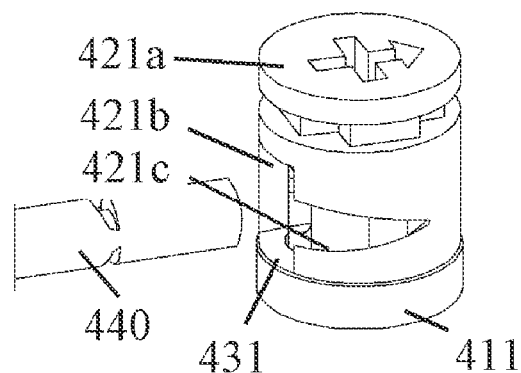

Reference is then made to FIG. 4f, when it is necessary to maintain or replace parts of the installation base 400, the foregoing operations can be performed in a reverse order; that is, the rotating portion 421a of the locking assembly 420 is rotated counterclockwise first, which actuates the circumferential wall of the conductive rotating locking member 421 to also rotate counterclockwise, so that the positions of the notch 421b and the locking groove 421c on the wall are changed; namely, the notch 421b replaces the locking groove 421c and returns to its original position, thereby achieving the resetting of the entire locking assembly 420. Then, the wire 440 is released and also reset due to the loss of pressure, thereby realizing the disassembly between the wire and the installation base. The wire 440 is taken out so that parts can be maintained or replaced.

Although not shown in the drawings, an embodiment of a fire detector or a fire alarm is also provided herein, which includes the installation base in any of the foregoing embodiments or a combination of these embodiments, and therefore has corresponding technical effects, which will not be repeated herein.

In addition, it should be noted that other parts of the fire detector or the fire alarm provided in the present application can be designed, manufactured and sold separately, or they can be assembled together before being sold as a whole. Either the single parts formed before the combination or the entirety formed after the combination will fall within the scope of protection of the present application.

In the above examples, the installation base and the fire detector or the fire alarm of the present application are mainly described. Although only some of the embodiments of the present application have been described, those skilled in the art should understand that the present application may be implemented in many other forms without departing from the spirit and scope thereof. Therefore, the illustrated examples and embodiments should be regarded as illustrative rather than restrictive, and the present application may cover various modifications and replacements without departing from the spirit and scope of the present application as defined by the appended claims.

The use of the terms "a", "an", "the", and similar references in the context of description (especially in the context of the following claims) are to be construed to cover both the singular and the plural, unless otherwise indicated herein or specifically contradicted by context. The modifier "about" used in connection with a quantity is inclusive of the stated value and has the meaning dictated by the context (e.g., it includes the degree of error associated with measurement of the particular quantity). All ranges disclosed herein are inclusive of the endpoints, and the endpoints are independently combinable with each other.

While the present disclosure has been described in detail in connection with only a limited number of embodiments, it should be readily understood that the present disclosure is not limited to such disclosed embodiments. Rather, the present disclosure can be modified to incorporate any number of variations, alterations, substitutions, combinations, sub-combinations, or equivalent arrangements not heretofore described, but which are commensurate with the scope of the present disclosure. Additionally, while various embodiments of the present disclosure have been described, it is to be understood that aspects of the present disclosure may include only some of the described embodiments.

Accordingly, the present disclosure is not to be seen as limited by the foregoing description but is only limited by the scope of the appended claims.

What is claimed is:

1. An installation base for use in a fire detector or a fire alarm, wherein the installation base comprises:
   a base body, which has a plurality of installation holes;
   a locking assembly arranged in one of the installation holes of the base body, the locking assembly configured to be switched between a locked position and a released position relative to the installation holes when the locking assembly is at least one of rotated and pressed; and
   one or more conductive assemblies configured to hold wires when the locking assembly is switched to the locked position to provide electrical conduction;
   wherein the locking assembly comprises:
      a rotating-and-pressing locking member and an elastic member; the rotating-and-pressing locking member has a shaft, and a rotating-and-pressing portion and a locking portion arranged at both ends of the shaft, and the locking portion protrudes in a radial direction of the shaft;
      the installation hole has a concave hole wall and an axial notch formed on the hole wall;
      wherein in the locked position, the locking portion of the locking assembly is stopped by the hole wall of the installation hole; and in the released position, the locking portion of the locking assembly is reset via the axial notch on the hole wall;
   or the locking assembly comprises:
      a pressing locking member and a rotating stopper; and the pressing locking member and the rotating stopper have stop teeth axially cooperating with each other;

the installation hole has a concave hole wall, an end of the hole wall presents stop teeth, and an axial notch is formed on the hole wall;

wherein in the locked position, the rotating stopper of the locking assembly is stopped by the hole wall of the installation hole; and in the released position, the rotating stopper of the locking assembly is reset via the axial notch on the hole wall;

or the locking assembly comprises:

a rotating locking member, and the rotating locking member has a shaft, and a rotating portion and a locking contact surface arranged at both ends of the shaft;

the installation hole has a stop portion that restricts an axial movement of the rotating locking member;

wherein an axial length of an abutting position of the locking contact surface and the conductive assembly in the locked position is greater than the axial length of the abutting position of the locking contact surface and the conductive assembly in the released position;

or the locking assembly comprises:

a conductive rotating locking member; and the conductive rotating locking member comprises a rotating portion, and a notch and a locking groove that are provided on a circumferential wall of the rotating portion;

the installation hole has a stop portion that restricts an axial movement of the conductive rotating locking member;

wherein in the locked position, the conductive rotating locking member of the locking assembly holds the wire onto the conductive assembly via the locking groove; and in the released position, the conductive rotating locking member of the locking assembly releases the wire via the notch.

2. The installation base according to claim 1, wherein the locking groove of the conductive rotating locking member has an edge for cutting off an outer cover of the wire.

3. The installation base according to claim 1, wherein the conductive assembly comprises a conductive substrate provided at a bottom of the conductive rotating locking member.

4. The installation base according to claim 1, wherein the conductive assembly comprises a conductive substrate arranged on the base body, and a pivotable conductive sheet, and when the locking assembly is switched to the locked position, the pivotable conductive sheet is pressed to hold the wire onto the conductive substrate, so that electrical conduction is realized.

5. The installation base according to claim 1, wherein the installation hole is configured to extend and protrude relative to one side of the base body.

6. A fire detector, comprising:

an installation base having:

a base body, which has a plurality of installation holes;

a locking assembly arranged in one of the installation holes of the base body, the one or more locking assemblies configured to be switched between a locked position and a released position relative to the installation holes when the locking assemblies are at least one of rotated and pressed; and one or more conductive assemblies configured to hold wires when the locking assemblies are switched to the locked position to provide electrical conduction; and a component of the fire detector configured to be supported on the installation base;

wherein the locking assembly comprises:

a rotating-and-pressing locking member and an elastic member; the rotating-and-pressing locking member has a shaft, and a rotating-and-pressing portion and a locking portion arranged at both ends of the shaft, and the locking portion protrudes in a radial direction of the shaft;

the installation hole has a concave hole wall and an axial notch formed on the hole wall;

wherein in the locked position, the locking portion of the locking assembly is stopped by the hole wall of the installation hole; and in the released position, the locking portion of the locking assembly is reset via the axial notch on the hole wall;

or the locking assembly comprises:

a pressing locking member and a rotating stopper; and the pressing locking member and the rotating stopper have stop teeth axially cooperating with each other;

the installation hole has a concave hole wall, an end of the hole wall presents stop teeth, and an axial notch is formed on the hole wall;

wherein in the locked position, the rotating stopper of the locking assembly is stopped by the hole wall of the installation hole; and in the released position, the rotating stopper of the locking assembly is reset via the axial notch on the hole wall;

or the locking assembly comprises:

a rotating locking member, and the rotating locking member has a shaft, and a rotating portion and a locking contact surface arranged at both ends of the shaft;

the installation hole has a stop portion that restricts an axial movement of the rotating locking member;

wherein an axial length of an abutting position of the locking contact surface and the conductive assembly in the locked position is greater than the axial length of the abutting position of the locking contact surface and the conductive assembly in the released position;

or the locking assembly comprises:

a conductive rotating locking member; and the conductive rotating locking member comprises a rotating portion, and a notch and a locking groove that are provided on a circumferential wall of the rotating portion;

the installation hole has a stop portion that restricts an axial movement of the conductive rotating locking member;

wherein in the locked position, the conductive rotating locking member of the locking assembly holds the wire onto the conductive assembly via the locking groove; and in the released position, the conductive rotating locking member of the locking assembly releases the wire via the notch.

7. The fire detector according to claim 6, wherein the locking groove of the conductive rotating locking member has an edge for cutting off an outer cover of the wire.

8. The fire detector according to claim 6, wherein the conductive assembly comprises a conductive substrate provided at a bottom of the conductive rotating locking member.

9. A fire detector, comprising:

an installation base having:

a base body, which has a plurality of installation holes;

one or more locking assemblies arranged in the installation holes of the base body, the one or more locking assemblies configured to be switched between a locked position and a released position relative to the installation holes when the locking assemblies are at least one of rotated and pressed; and one or more conductive assemblies configured to hold wires when the locking assemblies are switched to the locked position to provide electrical conduction; and a component of the fire detector configured to be supported on the installation base;

wherein the conductive assembly comprises a conductive substrate arranged on the base body, and a pivotable conductive sheet, and when the locking assembly is switched to the locked position, the pivotable conductive sheet is pressed to hold the wire onto the conductive substrate, so that electrical conduction is realized.

10. The fire detector according to claim 6, wherein the installation hole is configured to extend and protrude relative to one side of the base body.

11. A fire alarm, comprising:
an installation base having:
a base body, which has a plurality of installation holes;
one or more locking assemblies arranged in the installation holes of the base body, the one or more locking assemblies configured to be switched between a locked position and a released position relative to the installation holes when the locking assemblies are at least one of rotated and pressed; and one or more conductive assemblies configured to hold wires when the locking assemblies are switched to the locked position to provide electrical conduction; and a component of the fire alarm configured to be supported on the installation base;

wherein:
the one or more locking assemblies comprise a rotating-and-pressing locking member and an elastic member; the rotating-and-pressing locking member has a shaft, and a rotating-and-pressing portion and a locking portion arranged at both ends of the shaft, and the locking portion protrudes in a radial direction of the shaft;

the installation hole has a concave hole wall and an axial notch formed on the hole wall;

wherein in the locked position, the locking portion of the locking assembly is stopped by the hole wall of the installation hole; and in the released position, the locking portion of the locking assembly is reset via the axial notch on the hole wall.

\* \* \* \* \*